United States Patent [19]
Shimizu et al.

[11] Patent Number: 5,302,580
[45] Date of Patent: Apr. 12, 1994

[54] OXIDE SUPERCONDUCTOR LAMINATION

[75] Inventors: Hideki Shimizu, Nagoya; Takeyoshi Togashi, Okazaki; Hitoshi Higuchi; Toshio Oda, both of Nagoya; Hitoshi Yoshida, Okazaki, all of Japan

[73] Assignee: NGK Insulators, Ltd., Nagoya, Japan

[21] Appl. No.: 668,842

[22] Filed: Mar. 13, 1991

[30] Foreign Application Priority Data

| Mar. 14, 1990 | [JP] | Japan | 2-63406 |
| Mar. 14, 1990 | [JP] | Japan | 2-63407 |
| Mar. 26, 1990 | [JP] | Japan | 2-76253 |

[51] Int. Cl.$^5$ .................. H01B 12/00; B32B 15/00
[52] U.S. Cl. .................. 505/233; 428/632; 428/633; 505/925; 505/236; 505/237
[58] Field of Search .............. 428/632, 633, 669, 670, 428/672, 673, 674, 931, 932; 505/1, 706, 925, 926, 927

[56] References Cited

U.S. PATENT DOCUMENTS

| 3,473,217 | 10/1969 | Prior | 428/548 |
| 3,839,780 | 10/1974 | Freedman | 228/253 |
| 4,554,033 | 11/1985 | Dery et al. | 156/277 |
| 4,673,774 | 6/1987 | Wake et al. | 174/94 R |
| 4,994,435 | 2/1991 | Shiga et al. | 505/1 |
| 5,109,593 | 5/1992 | Benz et al. | 505/927 |
| 5,110,034 | 5/1992 | Simmonds | 505/927 |

FOREIGN PATENT DOCUMENTS

| 0371410 | 6/1990 | European Pat. Off. |  |
| 1952148 | 8/1970 | Fed. Rep. of Germany | 505/927 |
| 2-18657 | 7/1990 | Japan | 505/925 |
| 2-22809 | 9/1990 | Japan | 361/424 |
| 2-27618 | 11/1990 | Japan | 505/927 |

OTHER PUBLICATIONS

J. W. Ekin, et al., Appl. Phys. Lett. 52(21), May 23, 1988, pp. 1819-1821.
C. L. Chien, et al., Appl. Phys. Lett. 51(25), Dec. 21, 1987, pp. 2155-2157.

Primary Examiner—Benjamin R. Fuller
Assistant Examiner—Valeri Ann Lund
Attorney, Agent, or Firm—Adduci, Mastriani, Schaumberg & Schill

[57] ABSTRACT

An oxide superconductor lamination member has a base, precious metal plates and an oxide superconductor layer. The precious metal plates and the oxide superconductor layer are successively laminated on the base, and the precious metal plates overlap each other at their ends. Another oxide superconductor lamination member has precious metal bases, and an oxide superconductor layer lamination on the precious metal bases. The precious metal bases overlap each other at their ends. End portions of the precious metal plates (bases) are connected by an adhesive so as to form a lap joint. The lap joint of the precious metal plates (bases) are covered with a precious metal foil.

5 Claims, 10 Drawing Sheets

OXIDE SUPERCONDUCTOR LAMINATION

BACKGROUND OF THE INVENTION

This invention relates to an oxide superconductor lamination member and a method of manufacturing this member. More particularly, this invention relates to an oxide superconductor lamination member in which precious metal plates and an oxide superconductor layer are successively laminated on a base in such a manner that the precious metal plates overlap each other at their ends, and another oxide superconductor lamination member in which an oxide superconductor layer is laminated on each of precious metal bases and in which the precious metal bases overlap each other at their ends, and to a method of manufacturing these superconductor members.

Recently, oxide superconductors have attracted attention because of their high critical temperature and it is expected that they will be applied in various fields including that of electric power, that of magnetic resonance imaging apparatus and that of magnetic shield. To put oxide superconductors to practical use, instrumental elements or bases may be manufactured from oxide superconductors. On the other hand, a method of forming a layer of an oxide superconductor on an existing conventional base is known.

In a case where an oxide superconductor material is formed on a base, it is necessary to select a material for the base inactive in reaction with the oxide superconductor and having no effect of deteriorating the superconducting characteristics during firing of the oxide superconductor and/or to provide an intermediate inactive material. In addition, in a case where such a base material and/or intermediate inactive material are applied, a specific structure is required in which thermal stresses caused between the base or intermediate inactive material and the oxide superconductor are reduced and/or prevented from concentrating, since the present oxide superconductors are used by being cooled at liquid nitrogen temperature (77 K.).

Some superconductor members have been proposed. For example, Japanese Patent Laid-Open No. 63-305574 discloses an arrangement in which a stable material such as palladium (Pd), silver (Ag) or gold (Au) which does not react with other superconductor member materials is interposed between a base formed of, e.g., alumina, zirconia or a copper and an Y—Ba—Cu—O superconductor. Japanese Patent Laid-Open No. 1-173790 also discloses a superconductor member having a stabilized layer of, e.g., silver (Ag) formed on a Y—Ba—Cu—O superconductor.

In a case where an oxide superconductor is laminated on a precious metal plate such as a silver plate provided as a base or an intermediate layer to form a superconductor member large in size or length, it is necessary to connect several precious metal plates to each other at their ends to form one precious metal plate or precious metal cylinder constituting a base or intermediate layer having a large overall size, because it is difficult to form such as precious metal into the shape of one large plate. Also, in a case where a precious metal is elongated into a tape-like shape, the extent of elongation is limited for a reason in terms of manufacture so long as the metal is integrally formed, and it is necessary to connect end portions of precious metal tapes if a further elongation is required.

In particular, in the case of manufacture of a large cylindrical oxide superconductor member, a thick precious metal base is required and there is therefore the problem of a considerable increase in cost.

A type of oxide superconductor lamination member is therefore advantageous in terms of reduction in manufacture cost, which has a base formed of a material cheaper than precious metals and in which thin precious metal plates and an oxide superconductor layer are successively laminated on the base.

However, since the thickness of these precious metal plates is small and since it is difficult to manufacture one large precious metal plate, it is necessary to manufacture an intermediate layer precious metal plate having a large overall size by disposing several precious metal plates so that these metal plates overlap each other at their ends.

However, if a method of simply superposing end portions of precious metal plates is used or if a precious metal paste, glass, a superconductor material having the same composition as the superconductor layers and/or an inorganic adhesive consisting of a mixture of these materials is only applied to the overlapping or superposed portions, the following drawbacks are encountered. During firing for forming a superconductor layer on the base with a precious metal plate interposed therebetween, superconductor components penetrate through the overlap portions of the precious plates because the viscosity of the superconductor is very small at high temperatures, e.g., firing temperatures of 800° to 1100° C., and they react with an ordinary inorganic adhesive or a base material between the precious metal plates. Compounds produced by this reaction contaminate the superconductor layer so that the superconducting characteristics are considerably impaired. Moreover, the connected portions of the precious metal plates are easy to separate, and, as shown in FIG. 15(a), the thickness of the precious metal intermediate layer in the lap joint of precious metal plates 1, 1' is increased, so that a stepped portion X is formed at the lap-joint end of the precious metal plate on the oxide superconductor layer 3 side. The thickness of the superconductor layer 3 after firing is thereby made non-uniform at this stepped portion. In particular, if the superconductor member is manufactured by a firing process including the step of melting or partially melting the oxide superconductor, the non-uniformity of the thickness of the superconductor layer 3 after firing is considerably increased by the effect of the surface tension of the superconductor melt in the melting step. If the superconductor layer 3 has such a thickness non-uniformity at the stepped portion, the critical current thereof is reduced and stresses concentrate therein when the superconductor member is immersed in liquid nitrogen, resulting in occurrence of a crack 30 in the superconductor layer 3 at the stepped portion X, as shown in FIG. 15(b).

SUMMARY OF THE INVENTION

It is therefore an object of the present invention to provide an oxide superconductor lamination member in which lap joint portions of precious metal plates are firmly connected and do not separate or become broken in a wide temperature range from the firing temperature to the liquid nitrogen temperature, and which has uniform characteristics including suitable superconducting characteristics, as well as to provide a method of manufacturing this superconductor lamination member.

According to one aspect of the present invention, there is provided an oxide superconductor lamination member in which precious metal plates and an oxide superconductor layer are successively laminated on a base, and in which the precious metal plates overlap each other at their ends, and another oxide superconductor lamination member in which an oxide superconductor layer is laminated on precious metal bases, and in which the precious metal bases overlap each other at their ends.

According to another aspect of the present invention, there is provided an oxide superconductor lamination member in which precious metal plates and an oxide superconductor layer are successively laminated on a base, end portions of the precious metal plates being connected by an adhesive so as to form a lap joint, and in which with respect to one of the lap joint end portions of the precious metal plates on the oxide superconductor layer side, a relationship: $D/(d+a) \geq 1.5$ is satisfied where D is the thickness of the portions of the oxide superconductor layer corresponding to the portions of the precious metal plates other than the lap joint portions, d is the thickness of one of the lap joint portions of the precious metal plates on the oxide superconductor layer side, and a is the thickness of the adhesive layer in the lap joint of the precious metal plates, and another oxide superconductor lamination member in which an oxide superconductor layer is laminated on precious metal bases, end portions of the precious metal buses being connected by an adhesive so as to form a lap joint, in which with respect to one of the lap joint end portions of the precious metal bases on the oxide superconductor layer side, a relationship: $D/(d+a) \geq 1.5$ is satisfied where D is the thickness of the portions of the oxide superconductor layer corresponding to the portions of the precious metal bases other than the lap joint portions, d is the thickness of one of the lap joint portions of the precious metal bases on the oxide superconductor layer side, and a is the thickness of the adhesive layer in the lap joint of the precious metal bases.

According to still another aspect of the present invention, there is provided an oxide superconductor lamination member in which precious metal plates and an oxide superconductor layer are successively laminated on a base, end portions of the precious metal plates are connected so as to form a lap joint, and the lap joint of the precious metal plates is covered with a precious metal foil, and another oxide superconductor lamination member in which an oxide superconductor layer is laminated on the precious metal bases, end portions of the precious metal bases are connected so as to form a lap joint, and the lap joint of the precious metal bases is covered with a precious metal foil.

Preferably, the oxide superconductor lamination member having a precious metal foil is formed so that a relationship: $D/(d'+a') \geq 1.5$ is satisfied where D is the thickness of the portions of the oxide superconductor layer corresponding to the portions of the precious metal plates other than the lap joint portions, d' is the thickness of the precious metal foil, and a' is the thickness of adhesive layer in the joint of the precious metal plates between one of the precious metal plates on the oxide superconductor layer side and the precious metal foil.

According to a further aspect of the present invention, there is provided an oxide superconductor lamination member in which precious metal plates and an oxide superconductor layer are successively laminated on a base, end portions of the precious metal plates are connected so as to form a lap joint, and the lap joint portions of the precious metal plates are connected by an adhesive including a compound having a composition essentially consisting of at least two of the kinds of elements constituting the oxide semiconductor layer, and a method of manufacturing an oxide superconductor lamination member in which precious metal plates having end portions connected so as to form a lap joint are laid on a base with an inorganic adhesive interposed therebetween, and in which an oxide superconductor raw material is applied on the precious metal plates and is thereafter fired, the method comprising connecting the lap joint end portions of the precious metal plates by an adhesive including a compound having a composition essentially consisting of at least two of the kinds of elements constituting the oxide superconductor.

According to a still further aspect of the present invention, there is provided an oxide superconductor lamination member (superconductor lamination member I) in which precious metal plates and an oxide superconductor layer are successively laminated on a base, end portions of the precious metal plates are connected so as to form a lap joint, and at least one of the lap joint end portions of the precious metal plates located on the oxide superconductor side is reduced in thickness in comparison with the other portions, and another oxide superconductor lamination member (superconductor lamination member II) in which precious metal plates and an oxide superconductor layer are successively connected on a base, end portions of the precious metal plates are connected so as to form a lap joint, and the lap joint end portions of the precious metal plates have complementary shapes such that the thickness of the lap joint is generally equal to the thickness of each precious metal plate.

The superconductor lamination member I is manufactured by a method of manufacturing an oxide superconductor lamination member in which precious metal plates having end portions connected so as to form a lap joint are laid on a base with an inorganic adhesive interposed therebetween, and in which an oxide superconductor raw material is applied on the precious metal plates and is thereafter fired, the method comprising working at least one of the lap joint end portions of the precious metal plates on the oxide superconductor side so that the thickness of the end portion is smaller than that of the other portions. The superconductor lamination member II is manufactured by a method of manufacturing an oxide superconductor lamination member in which precious metal plates having end portions connected so as to form a lap joint are laid on a base with an inorganic adhesive interposed therebetween, and in which an oxide superconductor raw material is applied on the precious metal plates and is thereafter fired, the method comprising working the lap joint end portions of the precious metal plates so that the end portions have complementary shapes such that the thickness of the lap joint is generally equal to the thickness of each precious metal plate.

DESCRIPTION OF THE PREFERRED EMBODIMENT

The present invention will be described below in detail.

Basically, an oxide superconductor lamination member in accordance with the present invention is a member formed by inserting a precious metal plate between a base and an oxide superconductor layer, or a member in which an oxide superconductor layer is laminated on precious metal bases, and this oxide superconductor lamination member is characterized in that end portions of the precious metal plates (bases) are connected in an overlapping state.

It is not always necessary for these lap joint portions to be bonded by an adhesive. However, bonding with an adhesive is preferred for strong connection among the base, the precious metal plate and the oxide superconductor layers, and between each precious metal plate.

Figure 1:
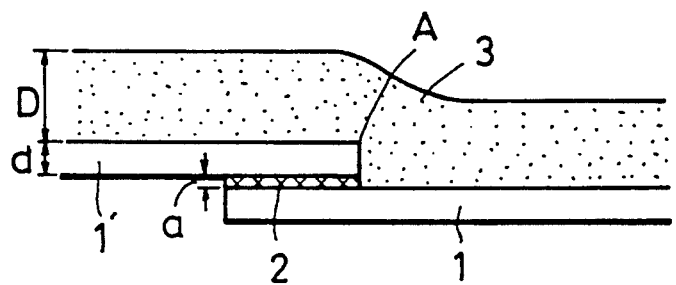
FIG. 1 is a cross-sectional view of a portion of an example of an oxide superconductor lamination member in which a superconductor layer is laminated on a lap joint of precious metal plates.

According to the present invention, it is preferable to form the lap joint of the precious metal plates 1, 1' in such a manner as to satisfy a relationship with respect to the end of the precious metal plate 1' in the lap joint: $D/(d+a) \geq 1.5$, as shown in FIG. 1 (D: the thickness of the portion of the oxide superconductor layer 3 on the non-joint portion of the precious metal plates, d: the thickness of the lap joint portion of precious metal plate 1' on the oxide superconductor layer side, a: the thickness of adhesive layer 2 in the lap joint of the precious metal plates). If $D/(d+a)<1.5$, the thickness of the oxide superconductor layer 3 in the vicinity of the end A of the precious metal plate 1' is so small that there is a risk of occurrence of a crack. In this case, however, it is preferable to round off the end A of the precious metal plate 1' to maintain the thickness of the oxide superconductor layer 3 laminated thereon, thereby preventing occurrence of a crack.

Figure 2:
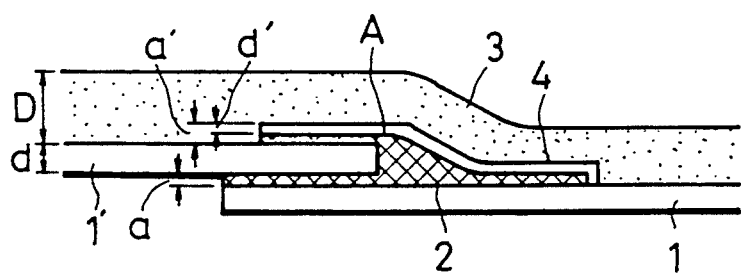
FIG. 2 is a cross-sectional view of a portion of an example of an oxide superconductor lamination member in which a precious metal foil is laid on a lap joint of precious metal plates.

Further, according to the present invention, it is preferable to cover the lap joint of the precious metal plates 1, 1' with a precious metal foil 4 in such a manner as to satisfy a relationship with respect to an end of the covering precious metal foil 4: $D/(d'+a') \geq 1.5$, as shown in FIG. 2 (D: the thickness of the portion of the oxide superconductor layer 3 on the non-joint portion of the precious metal plates, d': the thickness of the precious metal foil, a': the thickness of the adhesive layer in the joint between the precious metal plate 1' and the precious metal foil 4), whereby the thickness of the oxide superconductor layer 3 laminated on the lap joint is maintained and occurrence of a crack is prevented. Preferably, in this case, adhesive 2 is applied to the lap joint portions of the precious metal plates 1, 1' and to the surfaces of the precious metal plates 1, 1' and the precious metal foil 4 connected to each other, thereby increasing the strength of connection between these elements. It is further preferable to round off the end A of the precious metal plate 1' if the lap joint of the precious metal plates 1, 1' is covered with precious metal foil 4.

The kind of adhesive applied to the lap joint portions of the precious metal plates 1, 1' as described above is not specifically limited. For example, a material having the same composition as the oxide superconductor layer 3, a precious metal paste, glass or a mixture of these materials may suitably be used.

The present invention is characterized in its another aspect by applying a specific adhesive to the lap joint portions of the precious metal plates.

That is, according to another aspect of the present invention, an adhesive comprising a compound having a composition including at least two of the kinds of elements constituting the oxide superconductor layer is used as the adhesive applied to the lap joint portions of the precious metal plates. More specifically, $CuO_x$, $BaCuO_x$, $YBa_2Cu_2O_x$ or the like may be used if the oxide superconductor layer has, for example, an Y system (Y-Ba-CuO compound); $Bi_2Sr_2CaCu_2O_x$, $Bi_2SrCu_2O_x$ or the like may be used if the oxide superconductor layer has a Bi system (Bi-Sr-Ca-Cu-O compound); $Tl_2Sr_2CaCu_3O_x$ or the like may be used if the oxide superconductor layer has a Tl system (Tl-Sr-Ca-Cu-O compound); $CuO_x$, $SrCu_2O_x$, $LaSrCuO_x$ or the like may be used if the oxide superconductor layer has a La-Sr system (La-Sr-Cu-O compound); or $CuO_x$, $BaCu_2O_x$, $LaBaCuO_x$ or the like may be used if the oxide superconductor layer has a La-Ba system (La-Ba-Cu-O compound).

Further, according to still another aspect of the present invention, an end portion of at least one, that is located on the oxide superconductor layer side, of adjacent precious metal plates included in the lap joint is reduced in thickness in comparison with the other portion, or end portions of adjacent precious metal plates in the lap joint have complementary shapes such that the thickness of the lap joint is approximately equal to that of each precious metal plate.

The shapes of the end portions of the precious metal plates in the lap joint are thus specified, so that the obtained oxide superconductor lamination member is free of layer separation in a wide temperature range from the firing temperature to the liquid nitrogen temperature and has superconducting characteristics including the critical current (Jc) maintained with stability.

According to the present invention, the material of the base is not specifically limited. However, a metallic material is preferred which is nickel, copper, iron, stainless steel, HASTELLOY (a heat-resistant and corrosion resistant alloy which is mainly composed of nickel), INCONEL (a heat-resistant and corrosion resistant alloy which is mainly composed of nickel), INCOLOY, (a heat resistant and corrosion resistant alloy which is mainly composed or iron), enameled steel plate or the like, and which is capable of maintaining the fundamental structure at oxide superconductor firing temperatures of about 800° to 1100° C. Ceramics such as alumina, zirconia, magnesia, and strontium titanate are generally used as well as metals. However, metallic bases have the widest application range and a high industrial utility value because their manufacture costs are low and because they can be easily worked. Accordingly, it is advantageous in terms of industry to form a stable superconductor having superior superconducting characteristics on a metallic base.

The material of the precious metal plate provided as an intermediate layer in accordance with the present invention is at least one of silver, gold, palladium, platinum ruthenium, rhodium, osmium, iridium or a combination or at least two of them having a melting point of not lower than 900° C.

The thickness of the precious metal plate is 30 μm or greater, preferably, 50 to 500 μm or, more preferably, 50 to 200 μm. If the thickness of this plate is greater than 500 μm, the effect of stabilizing the superconductor layer is not improved while the manufacture cost is increased. If the thickness is smaller than 30 μm, there is a risk of the base being exposed depending upon the non-uniformity of the thickness or a risk of the active oxide superconductor reaching the interface between the precious metal plate and the base by diffusion at the interface between the superconductor layer and the precious metal plate at the time of firing of the oxide superconductor, and reacting with the components of the base so that the superconducting characteristics are considerably impaired. In this case, therefore, it is difficult to obtain a suitable oxide superconductor lamination member.

According to the present invention, the kind of oxide superconductor is not specifically limited. Bi oxide superconductors having a multilayer-Perovskite structure and a composition such that Bi is replaced with Pb can be used as well as various oxide superconductors of Bi, Y, Tl, La-Sr and L-Ba systems.

The oxide superconductor layer in accordance with the present invention may be formed by spray coating or powder coating using a powder of an oxide superconductor raw material or by attaching a green sheet formed from a powder of an oxide superconductor raw material by the doctor blade method, or a sintered body already fired to have superconducting properties.

The thickness of the oxide superconductor layer is preferably 50 to 5000 μm or, more preferably 100 to 1000 μm. If the thickness of this layer exceeds 5000 μm, the superconductor layer is easy to separate, or if the thickness is smaller than 50 μm, the thickness non-uniformity is considerable and suitable superconducting characteristics cannot be obtained.

The oxide superconductor lamination member in accordance with the present invention can be formed into any shape, e.g., the shape of a flat plate or cylindrical shape.

The lap-joint of the precious metal plates will now be described below.

Precious metal plate overlap-joining methods for the oxide superconductor lamination member of the present invention are generally grouped into two methods described below.

In the first joining method, an end portion of at least one, located on the oxide superconductor layer side, of adjacent precious metal plates included in the lap joint is reduced in thickness in comparison with the other portion. FIGS. 11(a) to 11(c), FIGS. 12(a) and 12(b) and FIGS. 13(a) to 13(d) show typical examples of this joining method.

Figure 11A:
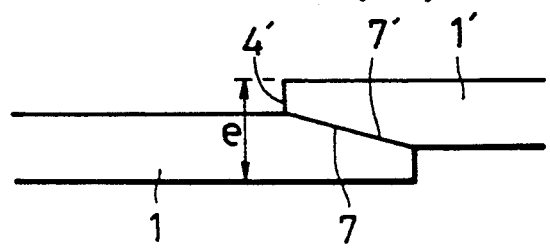
FIGS. 11(a) to 11(c), 12(a), 12(b), 13(a) to 13(d), 14(a), and 14(b) are cross-sectional views of examples of the shapes of end portions constituting lap joints of precious metal plates used for the oxide superconductor lamination members in accordance with the present invention.

In the example shown in FIG. 11(a), an end portion of each precious metal plate is worked so that the thickness e of the lap joint is smaller than the sum of the thicknesses of the two precious metal plates. In the example shown in FIGS. 11(b) and 11(c), only an end portion of the precious metal plate on the oxide superconductor layer side is worked. In the examples shown in FIGS. 11(a) to 11(c), end portion working is performed before firing the lap joint portions of the precious metal plates.

Figure 12A:
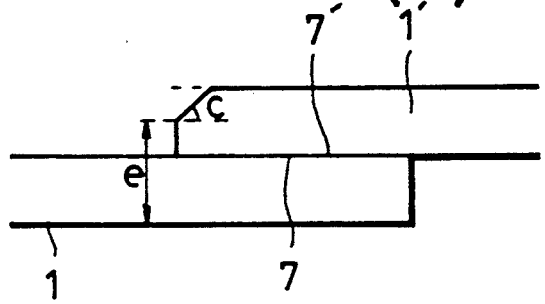

In the example shown in FIG. 12(a), the thickness e of the lap-joint-end portion is greater than the thickness of the lower precious metal plate but is not greater than the sum of the thicknesses of the lower and the upper precious metal plates 1, 1', and the angle c at which the end of the upper precious metal plate 1' is worked is $0<c<90°$. In the example shown in FIG. 12(b), the thickness e of the lap-joint-end portion is equal to the thickness of the lower precious metal plate 1, and the angle c at which the end of the upper precious metal plate 1' is worked is $0<c<90°$.

Figure 13A:
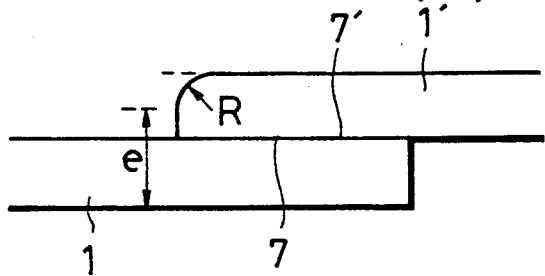
Figure 13B:
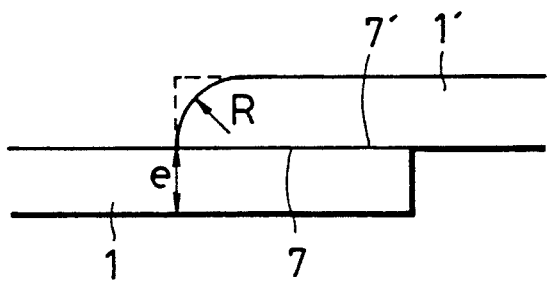
Figure 13C:
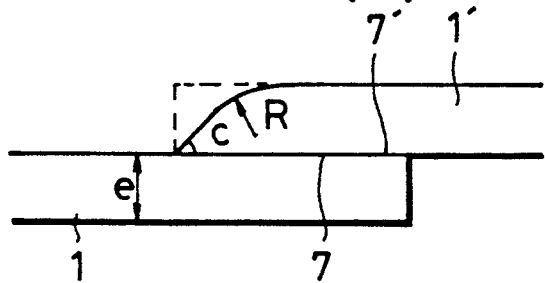
Figure 13D:
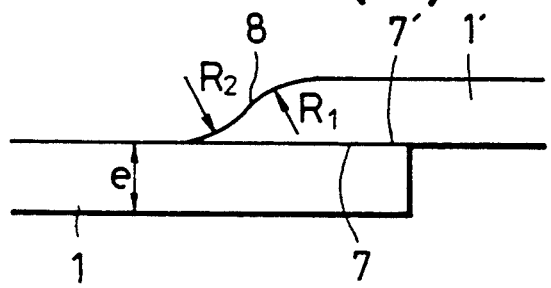

In the examples shown in FIGS. 13(a) to 13(d), the end of the upper precious metal plate 1' is rounded. In the example shown in FIG. 13(a), the thickness e of the lap-joint-end portion is greater than the thickness of the lower precious metal plate 1 but is not greater than the sum of the thicknesses of the lower and upper precious metal plates 1, 1', and the radius of curvature R is smaller than the thickness of the lap joint portion of the upper precious metal plate 1'. In the example shown in FIG. 13(b), the thickness e of the lap-joint-end portion is equal to that of the lower precious metal plate 1, and R is greater than the thickness of the lap joint portion of the upper precious metal plate 1'. FIGS. 13(c) and 13(d) show states in which the thickness e of the lap-joint-end portion is equal to the thickness of the lower precious metal plate 1, and in which the rounded end of the upper precious metal plate 1' has a composite curved shape.

In the case of the examples shown in FIGS. 12(a), 12(b), 13(a) to 13(d), the end portion is worked after firing of the lap joint of the precious metal plates.

Figure 14A:
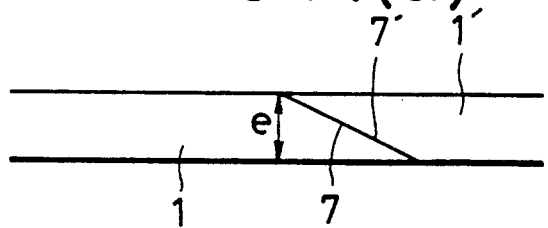
Figure 14B:
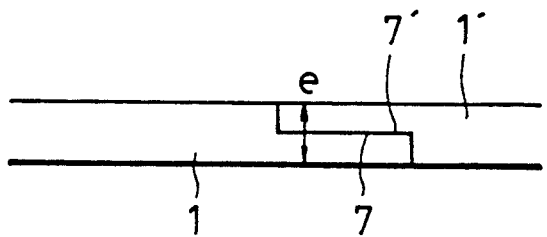
Figure 15A:
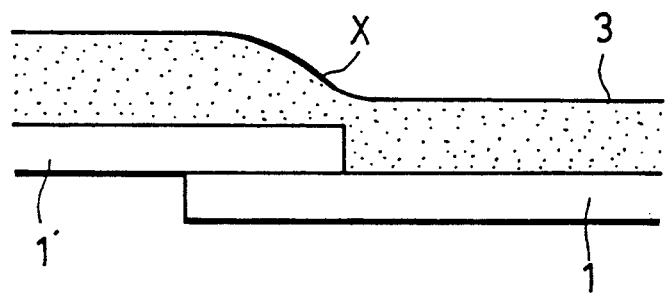
FIGS. 15(a) and 15(b) are cross-sectional views of states in which a superconductor layer is laminated on a lap joint of precious metal plates simply disposed in an overlapping manner.
Figure 15B:
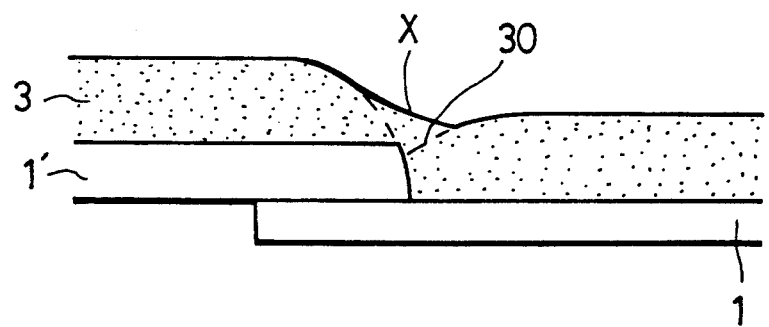

The second joint method forms a joint in which mating lap-joint-end portions of adjacent precious metal plates have complementary shapes such that the thickness of the lap joint is approximately equal to that of each precious metal plate. FIGS. 14(a) and 14(b) show typical examples of this joint method.

In the example shown in FIG. 14(a), the end portions of the precious metal plates have tapered complementary shapes, the taper surfaces are superposed on each other, and the thickness e of the lap joint is approximately equal to the thickness of each precious metal plate. In the example shown in FIG. 14(b), the end portions of the precious metal plates are worked to have a reduced thickness and complementary shapes, and the worked surfaces are superposed on (fitted to) each other. The thickness of the lap joint is approximately equal to that of each precious metal plate. In the examples shown in FIGS. 14(a) and 14(b), the end portions are worked before firing the lap joint of the precious metal plates.

A preferred example of the method of working the end portions of the precious metal plates is a grinding method using a grinder or sand paper. There are other possible methods including machining, chemical processing, and laser working.

An example of the process of manufacturing the oxide superconductor lamination member in accordance with the present invention will be described below.

First, several precious metal plates are prepared and a precious metal plate used as an intermediate layer is formed by one of the following methods:

1) the method of superposing and connecting the end portions while applying an adhesive therebetween so that the above-mentioned relationship $D/(d+a) \geq 1.5$.
2) the method of superposing the end portions and covering the lap joint with a precious metal foil,
3) the method of working the end portions into desired shapes and thereafter superposing them,
4) the method of superposing and connecting the end portions with an adhesive comprising a compound having a composition including at least two of the kinds of elements constituting the oxide superconductor.
5) combination of the methods 1) and 3),
6) combination of the methods 1), 3) and 4),
7) combination of the methods 2) and 4),
8) combination of the methods 3) and 4).

Thereafter, the precious metal plate is laid on the base with an inorganic adhesive such as glass interposed therebetween.

Next, the base and the precious metal plate laid thereon are fired and are further fired after covering the precious metal plate with an oxide superconductor raw material, or the precious metal plate laid on the base is covered with an oxide superconductor raw material and these materials are thereafter fired together, thereby obtaining an oxide superconductor lamination member in accordance with the present invention.

Alternatively, the oxide superconductor lamination member may be manufactured by working the end portions of the precious metal plates into desired shapes after the precious metal plates have been fired and connected to the base, covering the precious metal plates with an oxide superconductor raw material and thereafter firing these materials.

Also, the process of manufacturing the oxide superconductor lamination member may alternatively be such that after the end portions of the precious metal plates have been worked into desired shapes, they are superposed to form a precious metal plate having a predetermined size, which is connected to the base, and that after connecting the precious metal plate, the end portions of the precious metal plate are further worked, the precious metal plate is covered with an oxide superconductor raw material, followed by firing.

In this case, with respect to the formation of the oxide superconductor layer, if an organic binder or an organic solvent is used for slurry coating, a heat treatment is preferably effected as a pretreatment at 500° to 930° C. for a certain period of time in an oxygen containing atmosphere before firing, thereby limiting the amount of residual carbon to a percent smaller than 0.5%.

Firing is effected in oxygen gas or an oxygen containing gas atmosphere in air. In some cases, the fired member is cooled in a gas atmosphere rich in nitrogen according to the kind of superconductor. The firing temperature may be selected according to the superconductor raw material and the kind of superconductor to be manufactured; it may be not lower than 800° C. and not higher than 1100° C.

EXAMPLES

The present invention will be described below in more detail with respect to examples thereof although the present invention is not limited to them.

EXAMPLE 1

Silver (Ag) plates 1 having a size of 450 (width) × 620 (length) × 0.3 (thickness) mm were arranged so as to overlap on each other by 30 mm at their ends.

Next, a slurry prepared by mixing toluene and PVB (polyvinylbutyral) in a powder of an Bi-Sr-Ca-Cu oxide superconductor raw material was applied by spray coating and was dried. The materials were thereafter fired in an oxygen atmosphere at 890° C. at the maximum, thereby obtaining an oxide superconductor lamination member in the form of a flat plate in which an oxide superconductor layer 3 having a thickness of 0.5 mm was laminated on the silver plate 1.

This lamination member was tested and evaluated by a method described below with reference to FIGS. 6(a) and 6(c).

Figure 6A:
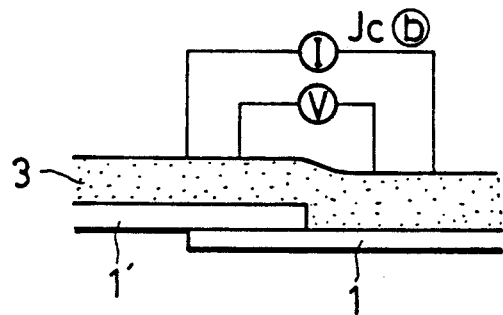
FIG. 6(a), 6(b), 6(c) and 7 are diagrams of a method of testing and evaluating an oxide superconductor lamination member.
Figure 6B:
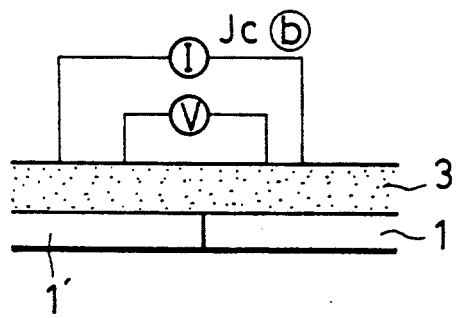
Figure 6C:
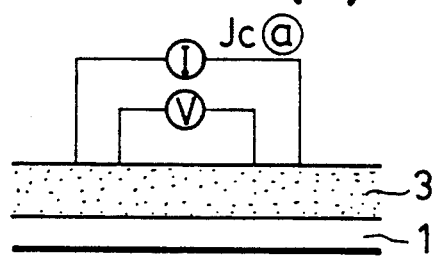

As shown in FIGS. 6(a) and 6(c), the critical current density (Jc) of the oxide superconductor layer 3 measured at a portion of the silver plate 1' other than the lap joint portion is set as Jc ⓐ, while the critical current density (Jc) of the oxide superconductor layer 3 measured at the lap joint portion of the silver plates 1, 1', i.e., between a portion of the silver plate 1' other than the lap joint portion and a portion of the silver plate 1 other than the lap joint portion is set as Jc ⓑ. Then, ○ is entered in Table 1 if (Jc ⓑ/Jc ⓐ)×100≧80, △ is entered if (Jc ⓑ/Jc ⓐ)×100<80, or × is entered if (Jc ⓑ/Jc ⓐ)×100<40.

The method used to test and evaluate Examples 2 to 5 described below is as shown in FIGS. 6(a) and 6(c) and the same as Example 1, while the method used to test and evaluate Comparative Examples 1 to 5 is as shown in FIGS. 6(b) and 6(c).

EXAMPLE 2

An oxide superconductor lamination member was manufactured in the same way as Example 1 except that an adhesive (a silver paste made by E. I. Du Pont de Nemours and Co.) 2 was applied to the lap joint portions of silver plates 1, 1' as shown in FIG. 1, and the lamination member obtained was tested and evaluated by the same method as Example 1. The results of this test and evaluation are shown in Table 1.

EXAMPLE 3

Figure 3:
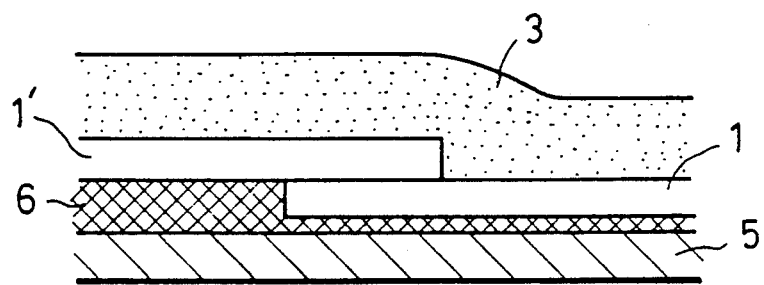
FIG. 3 is a cross-sectional view of a portion of an example of an oxide superconductor lamination member in accordance with the present invention.

A stainless steel enamel (SC-2710S, made by Nihon Frit K. K.) provided as an inorganic adhesive 6 was applied on a metallic base (stainless steel SUS304 plate) 5 in the form of a flat plate having a size of 500×500×1.6 (thickness) mm, and silver plates 1, 1' and an oxide superconductor layer 3 were laminated thereon in the same way as Example 1, thereby manufacturing an oxide superconductor lamination member such as that shown in FIG. 3. The oxide superconductor lamination member manufactured was tested and evaluated by the same method as Example 1. The results are shown in Table 1.

EXAMPLES 4 AND 5

An oxide superconductor lamination member was manufactured in the same way as Example 3 except that adhesive 2 was applied to the lap joint portions of silver plates 1, 1'. The oxide superconductor lamination member obtained was tested and evaluated by the same method as Example 1. The results are shown in Table 1.

In Example 4, the same kind of adhesive (silver paste made by Du Pont) was applied between the lap joint portions of the silver plates 1, 1' and between the metallic base and the silver plates, while in Example 5 the adhesive (silver paste made by Du Pont) applied to the lap joint portions of the silver plates 1, 1' was different from the adhesive (stainless steel enamel (SC-2710S, made by Nihon Frit).

COMPARATIVE EXAMPLE 1

Figure 4:
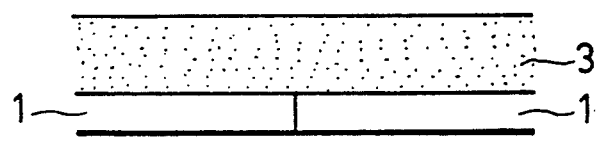
FIG. 4 is a cross-sectional view of a portion of an example of an oxide superconductor lamination member in which a superconductor layer is laminated on precious metal plates connected by a butt joint.

An oxide superconductor lamination member was manufactured, tested and evaluated in the same way as Example 1 except that silver plates 1 were brought into abutment against each other, as shown in FIG. 4. The results of the test and evaluation are shown in Table 1.

COMPARATIVE EXAMPLE 2

A test and evaluation were conducted in the same way as Comparative Example 1 except that an adhesive was applied to the abutting portions. The results are shown in Table 1.

COMPARATIVE EXAMPLE 3

A stainless steel enamel (SC-2710S, made by Nihon Frit) provided as an inorganic adhesive was applied on a metallic base (stainless steel SUS304 plate) in the form of a flat plate having a size of 500×500×1.6 (thickness) mm, and the oxide superconductor lamination of Comparative Example 2 was superposed thereon, thereby manufacturing an oxide superconductor lamination member. The oxide superconductor lamination member obtained was tested and evaluated in the same way as Example 1. The results are shown in Table 1.

COMPARATIVE EXAMPLE 4

A stainless steel enamel (SC-2710S, made by Nihon Frit) provided as an inorganic adhesive was applied on a metallic base (stainless steel SUS304 plate) in the form of a flat plate having a size of 500×500×1.6 (thickness) mm, and the oxide superconductor lamination of Comparative Example 1 was superposed thereon, thereby manufacturing an oxide superconductor lamination member. The oxide superconductor lamination member obtained was tested and evaluated in the same way as Example 1. The results are shown in Table 1.

COMPARATIVE EXAMPLE 5

A test and evaluation were conducted in the same way as Comparative Example 1 except that the abutting portions of the silver plates 1 were connected by brazing. The results are shown in Table 1.

As is apparent from Table 1, in the case of butt joining of Comparative Examples 1 to 5, the obtained oxide superconductor lamination member has inferior superconducting characteristics because of a crack or breakage of the superconductor layer starting from the butt joint portion or the reaction of superconductor components with the base. In contrast, in the case of lap joining of the precious metal plates of Examples 1 to 5, the superconducting characteristics of the oxide superconductor lamination member at the lap joint are good.

TABLE 1-1

|  | Example 1 | Example 2 | Example 3 | Example 4 | Example 5 |
| --- | --- | --- | --- | --- | --- |
| Condition | Precious metal plates lap-joined No adhesive | Precious metal plates lap-joined Some adhesive | Precious metal plates lap-joined No adhesive in lap joint Metallic base and precious metal plates connected by adhesive | Precious metal plates lap-joined Some adhesive in lap joint Metallic base and precious metal plates connected by adhesive | Precious metal plates lap-joined Some adhesive in lap joint Metallic base and precious metal plates connected by adhesive (Lap joint adhesive is different from adhesive for metallic base and precious metal plates) |
| Results | Good superconducting characteristics A crack occurred from lap joint at third cycle of thermal test | Good superconducting characteristics No crack occurred from lap joint during 10 cycles of thermal test | Good superconducting characteristics A crack occurred from lap joint at third cycle of thermal test | Good superconducting characteristics No crack occurred from lap joint during 10 cycles of thermal test | Good superconducting characteristics No crack occurred from lap joint during 10 cycles of thermal test |
| Evaluation | Δ | ○ | Δ | ○ | ○ |

(Note)
Evaluation (Jc ⓑ/Jcⓐ)  ○ : good Δ: not defective, X: defective

TABLE 1-2

|  | Comparative Example 1 | Comparative Example 2 | Comparative Example 3 | Comparative Example 4 | Comparative Example 5 |
| --- | --- | --- | --- | --- | --- |
| Condition | No adhesive Precious metal plates abutting | Some adhesive Precious metal plates butt-joined | Some adhesive Precious metal plates butt-joined | Metallic base and precious metal plates connected | Precious metal plates brazed |

TABLE 1-2-continued

|  | Comparative Example 1 | Comparative Example 2 | Comparative Example 3 | Comparative Example 4 | Comparative Example 5 |
|---|---|---|---|---|---|
|  |  |  | metallic base | by adhesive Precious metal plates abutting |  |
| Results | Cracked from butt portion Broken at butt portion | Cracked from butt joint portion Broken at butt joint portion | Reacted with metallic base | Reacted with metallic base | Reacted with braze material |
| Evaluation | X | X | X | X | X |

(Note)
Evaluation (Jc ⓑ/Jcⓐ) ○ : good △: not defective, X: defective

EXAMPLES 6 to 11, COMPARATIVE EXAMPLES 6 to 12

With respect to the oxide superconductor lamination member obtained in the same way as Example 2, the thickness d of precious metal plate 1', the thickness a of adhesive layer 2 and the thickness D of oxide superconductor layer 3 as shown in FIG. 1 were changed as shown in Table 2, and the material of the superconductor layer was also changed as shown in Table 2. The superconductor members thereby obtained were tested and evaluated.

As is apparent from the results shown in Table 2, when the lap joint of the precious metal plates satisfies the relationship $D/(d+a) \geq 1.5$, there were no deteriorations in the superconducting characteristics after the completion of the thermal cycles or, if the above relationship is not satisfied, there were some deterioration in the superconducting characteristics of the obtained oxide superconductor lamination member at the lap joint after the completion of the thermal cycles, although the characteristics were good before the thermal cycles.

TABLE 2

| No. | Super-conductor | D (μm) | d (μm) | a (μm) | D/(d + a) | Evaluation I | Evaluation II | Total Evaluation |
|---|---|---|---|---|---|---|---|---|
| Example 6 | YBCO | 500 | 300 | 20 | 1.56 | ○ | ○ | ◉ |
| Example 7 | YBCO | 300 | 150 | 50 | 1.50 | ○ | ○ | ◉ |
| Example 8 | BSCCO | 300 | 150 | 50 | 1.50 | ○ | ○ | ◉ |
| Example 9 | BSCCO | 300 | 100 | 20 | 2.50 | ○ | ○ | ◉ |
| Example 10 | BSCCO | 300 | 50 | 20 | 4.30 | ○ | ○ | ◉ |
| Example 11 | BSCCO | 300 | 300 (End was rounded.) d' = 100 | 20 | 0.94 (d = 300) 2.50 (d' = 100) | ○ | ○ | ◉ |
| Ref. Ex. 6 | YBCO | 300 | 300 | 20 | 0.94 | X | ○ | △ |
| Ref. Ex. 7 | BSCCO | 300 | 300 | 50 | 0.86 | X | ○ | △ |
| Ref. Ex. 8 | YBCO | 400 | 300 | 20 | 1.25 | X | ○ | △ |
| Ref. Ex. 9 | BSCCO | 300 | 200 | 50 | 1.2 | X | ○ | △ |
| Ref. Ex. 10 | BSCCO | 300 | 200 | 20 | 1.36 | X | ○ | △ |
| Ref. Ex. 11 | BSCCO | 500 | 300 | 50 | 1.43 | X | ○ | △ |
| Ref. Ex. 12 | YBCO | 500 | 300 | 50 | 1.43 | X | ○ | △ |

Total Evaluation ○ : Excellent, △: Good.

Figure 5:
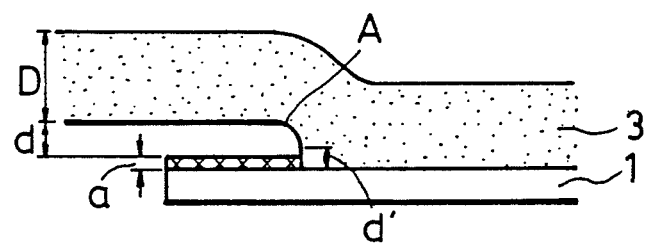
FIG. 5 is a cross-sectional view of a portion of an example of an oxide superconductor lamination member in which an end of a precious metal plate is rounded.

With respect to Example 11, the end A of the precious metal plate 1' was rounded as shown in FIG. 5.

Figure 7:
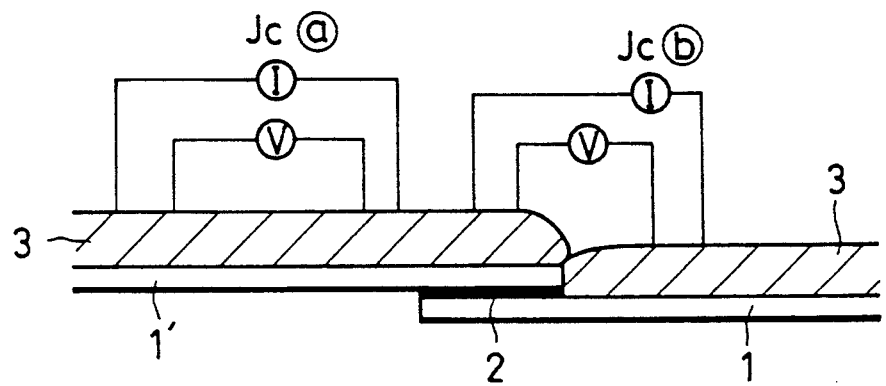

Evaluation I was effected in a way described below. The critical current density (Jc) of the oxide superconductor layer 3 of each oxide superconductor lamination member (initial value) is measured at the lap joint of the precious metal plates 1, 1', as shown in FIG. 7, and in the same way as Example 1. The oxide superconductor lamination member also undergoes a thermal cycle test such as to be maintained at −196° C. for 30 minutes in liquid nitrogen, then heated up to room temperature and maintained at this temperature for 30 minutes. The critical current density (Jc) after 10 cycles of this operation is compared with the initial value. If there is no deterioration in the characteristics, ○ is marked or, if there is a deterioration in the characteristics, X is marked.

Evaluation II was effected based on the arrangement shown in FIG. 7 in such a manner that ○ is marked if (Jcⓑ/Jcⓐ)×100≧80, △ is marked if (Jcⓑ/Jcⓐ)×100<80, or X is marked if (Jcⓑ/Jcⓐ)×100<40, as in the case of evaluation of Example 1.

EXAMPLES 12 TO 17, COMPARATIVE EXAMPLES 13, 14

An oxide superconductor lamination member was manufactured in the same way as Example 2 except that the lap joint of precious metal plates 1, 1' was covered with silver foil 4. With respect to this oxide superconductor lamination member, the thickness d of precious metal plate 1', the thickness d' of silver foil 4, the thickness a of adhesive layer 2, the thickness a' of adhesive layer 2 between precious metal plate 1' on the superconductor layer side and silver foil 4 and the thickness D of oxide superconductor layer 3 as shown in FIG. 2 were changed as shown in Table 3, and the material of the superconductor layer was also changed as shown in Table 3. The superconductor members thereby obtained were tested and evaluated.

The evaluation was effected in the same way as Examples 6 to 11. The results of this evaluation are shown in Table 3.

As is apparent from the results shown in Table 3, in the case where the lap joint is covered with the precious metal foil, there is no deterioration in the superconducting characteristics after the thermal cycles.

TABLE 3

| No. | Super-conductor | D | d | a | d' | a' | D/(d + a) | D/(d' + a') | Evaluation I | Evaluation II | Total Evaluation |
|---|---|---|---|---|---|---|---|---|---|---|---|
| Example 12 | YBCO | 300 | 300 | 20 | 100 | 20 | 0.94 | 2.5 | ○ | ○ | ◎ |
| Example 13 | YBCO | 300 | 300 | 20 | 50 | 20 | 0.94 | 4.3 | ○ | ○ | ◎ |
| Example 14 | YBCO | 100 | 300 | 20 | 30 | 20 | 0.31 | 2.0 | ○ | ○ | ◎ |
| Example 15 | BSCCO | 300 | 300 | 20 | 100 | 40 | 0.94 | 2.1 | ○ | ○ | ◎ |
| Example 16 | BSCCO | 300 | 300 | 20 | 50 | 20 | 0.94 | 4.3 | ○ | ○ | ◎ |
| Example 17 | BSCCO | 100 | 300 | 20 | 30 | 20 | 0.31 | 2.0 | ○ | ○ | ◎ |
| Ref. Ex. 13 | YBCO | 300 | 300 | 20 | — | — | 0.94 | — | X | ○ | Δ |
| Ref. Ex. 14 | BSCCO | 300 | 300 | 20 | — | — | 0.94 | — | X | ○ | Δ |

Total Evaluation ○ : Excellent, Δ: Good.

EXAMPLES 18 TO 41

Figure 8:
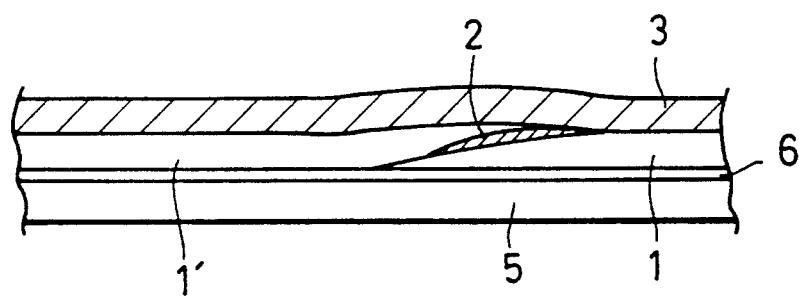
FIG. 8 is a cross-sectional view of a portion of an oxide superconductor lamination member in accordance with the present invention, showing another example of the lap joint of precious metal plates.
Figure 9:
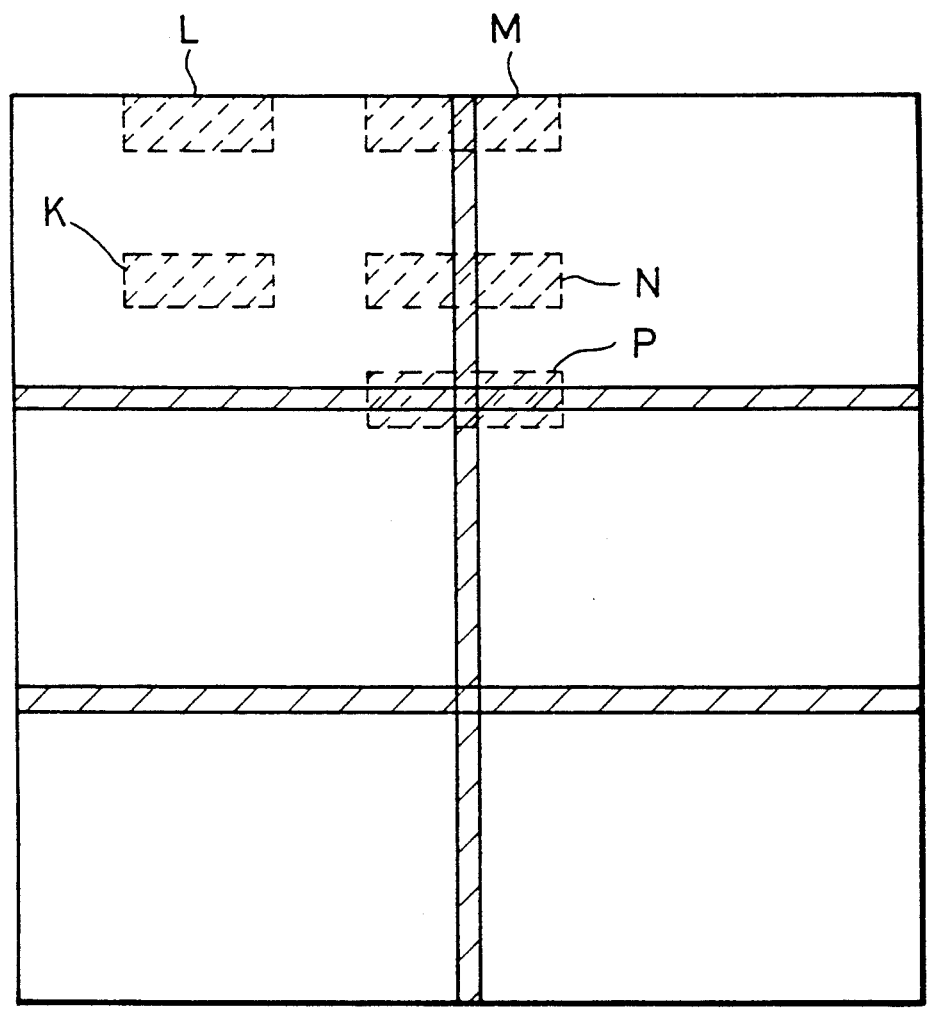
FIG. 9 is a plan view of an example of a state in which several precious metal plates are connected in a lap joint manner.

A stainless steel enamel (SC-2710S, made by Nihon Frit) provided as an inorganic adhesive 6 was applied on a metallic base (stainless steel SUS304 plate) 5 in the form of a flat plate having a size of 1200×1200×6 (thickness) mm, and silver plates (or gold (Au) plates) 1, 1' having a size of 420 (width)×615 (length)×0.3 (thickness) mm were jointed to the base by each of the lap-joint methods shown in FIGS. 8 and 9 so as to overlap at their ends by 30 mm.

At this time, adhesive 2 of each of the various superconductor systems shown in Table 1 prepared as a paste was applied to lap joint portions of silver plates (gold plates) 1, 1' and was baked at 900° C. for one hour to bond the plates.

Next, a slurry prepared by mixing ethyl alcohol and a dispersant on the market with each of raw material powders of oxide superconductors of Y, Bi, Tl, La-Sr, and La-Ba systems was applied by spray coating and was dried. Thereafter, the materials were fired at 800° to 1100° C. in an oxygen atmosphere. According to the kind of superconductor, the materials are cooled in a nitrogen gas atmosphere. Oxide superconductor lamination members in the form of flat plates in which an oxide superconductor layer 3 was laminated on the silver plates 1, 1' were thereby obtained.

Each of these lamination members was subjected to a thermal cycle joining strength test such as to be maintained at −196° C. for one hour in liquid nitrogen, then heated up to 20° C. and maintained at this temperature for one hour. Also, a superconducting characteristic [critical current density (Jc)] of a test piece of a certain size cut out from the lamination member at the position of a joint portion N shown in FIG. 9 was measured. The value of this characteristic relative to the value of the corresponding characteristic of another test piece cut out at a position K shown in FIG. 9 when the latter value is set to 100 is indicated to evaluate the influence of the kind of adhesive applied to the joint portions as shown in FIG. 8. The results of this test and measurement are shown in Table 4.

COMPARATIVE EXAMPLES 15 TO 18

Oxide superconductor lamination members were manufactured in the same way as Examples 18 to 41 except that adhesive 2 applied to the lap joint portions of silver plates (gold plates) 1, 1' was changed. The superconductor members manufactured were tested in the same way as Examples 18 to 41. The results are shown in Table 4.

TABLE 4

| Example, Comparative Example No. | Oxide superconductor layer | Adhesive | Precious metal joint strength thermal cycles (times) Ag | Precious metal joint strength thermal cycles (times) Au | Influence upon superconducting characteristics | Total evaluation | Remarks |
|---|---|---|---|---|---|---|---|
| Example 18 | Y system only | $CuO_x$ | — | 7 | 100 | ◎ | |
| Example 19 | Y system only | $BaCuO_x$ | — | 5 | 80 | ○ | |
| Example 20 | Y system only | $BaCu_2O_x$ | — | 8 | 90 | ○ | |
| Example 21 | Y system only | $Ba_2CuO_x$ | — | >10 | 70 | ○ | |
| Example 22 | Y system only | $YBa_2Cu_3O_x$ | — | >10 | 100 | ○ | |
| Example 23 | Bi system, Tl system | $CuO_x$ | — | 7 | 80 | ○ | |
| Example 24 | Bi System, Tl system | $CaCuO_x$ | >10 | 6 | 70 | ○ | |
| Example 25 | Bi System, Tl system | $CaCu_2O_x$ | — | 8 | 80 | ○ | |
| Example 26 | Bi System, Tl system | $SrCu_2O_x$ | 9 | — | 80 | ○ | |
| Example 27 | Bi System, Tl system | $Sr_{0.5}Ca_{0.5}CuO_x$ | 8 | — | 90 | ○ | |
| Example 28 | Bi System, Tl system | $SrCa_2Cu_5O_x$ | 5 | — | 90 | ○ | |
| Example 29 | Bi system only | $Bi_2Sr_2CaCu_2O_x$ | >10 | — | 100 | ◎ | |
| Example 30 | Bi system only | $Bi_2Sr_2Ca_2Cu_3O_x$ | >10 | — | 100 | ◎ | |
| Example 31 | Bi system only | $Bi_2S_2CuO_x$ | 7 | — | 90 | ○ | |
| Example 32 | Bi system only | $Bi_{1.4}Pb_{0.6}Sr_2CaCu_2O_x$ | >10 | — | 100 | ◎ | (Bi—Pb system) |
| Example 33 | Tl system only | $Tl_2Sr_2Ca_2Cu_3O_x$ | >10 | — | 100 | ◎ | |
| Example 34 | Tl system only | $Tl_{1.4}Pb_{0.6}Sr_2CaCu_3O_x$ | >10 | — | 100 | ◎ | (Tl—Pb system) |
| Example 35 | La—Sr system | $CuO_x$ | — | 7 | 80 | ○ | |
| Example 36 | La—Sr system | $SrCu_2O_x$ | — | 6 | 70 | ○ | |
| Example 37 | La—Sr system | $Sr_3Cu_5O_x$ | — | 7 | 80 | ○ | |
| Example 38 | La—Sr system | $LaSrCuO_x$ | — | 9 | 100 | ◎ | |
| Example 39 | La—Ba system | $CuO_x$ | — | 7 | 80 | ○ | |
| Example 40 | La—Ba system | $BaCu_2O_x$ | — | 6 | 80 | ○ | |
| Example 41 | La—Ba system | $LaBaCuO_x$ | — | 9 | 100 | ◎ | |
| Comparative Example 15 | | Glass ($SiO_2$—$B_2O_3$ system) | 4 | 5 | 0 | X | |
| Comparative Example 16 | | Silver braze | 8 | — | 30 | Δ | |
| Comparative Example 17 | | Silver paste | 1 | — | 20 | X | |

TABLE 4-continued

| Example, Comparative Example No. | Oxide superconductor layer | Adhesive | Precious metal joint strength thermal cycles (times) Ag | Precious metal joint strength thermal cycles (times) Au | Influence upon superconducting characteristics | Total evaluation | Remarks |
| --- | --- | --- | --- | --- | --- | --- | --- |
| Comparative Example 18 | | Unused | 1 | — | 0 | X | Precious metal not joined |

⊚ : excellent ○ : good ∆: Inferior X: very inferior

EXAMPLES 42 TO 46

Oxide superconductor lamination members were manufactured in the same way as Examples 18 to 41 by using SUS430, SUS310S, INCONEL 625, INCONEL 600, and INCOLOY 805 as bases 5 and $Bi_2Sr_2CaCu_2O_x$ as adhesive 5, and were tested in the same way as Examples 18 to 41. The results are shown Table 5.

EXAMPLES 47 TO 50 COMPARATIVE EXAMPLE 19

Oxide superconductor lamination members were manufactured in the same way as Examples 18 to 41 by changing silver plates having different thicknesses of 30, 50, 100, 300 and 500 μm used as intermediate layers and by using $Bi_2Sr_2CaCu_2O_x$ as adhesive 2, and were tested in the same way as Examples 18 to 41. The results are shown in Table 5.

EXAMPLES 51 TO 54

Figure 10A:
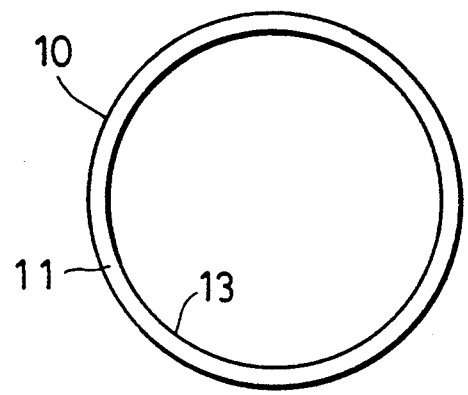
FIGS. 10(a) and 10(b) are a plan view and a side view of an example of a cylindrical oxide superconductor lamination member.
Figure 10B:
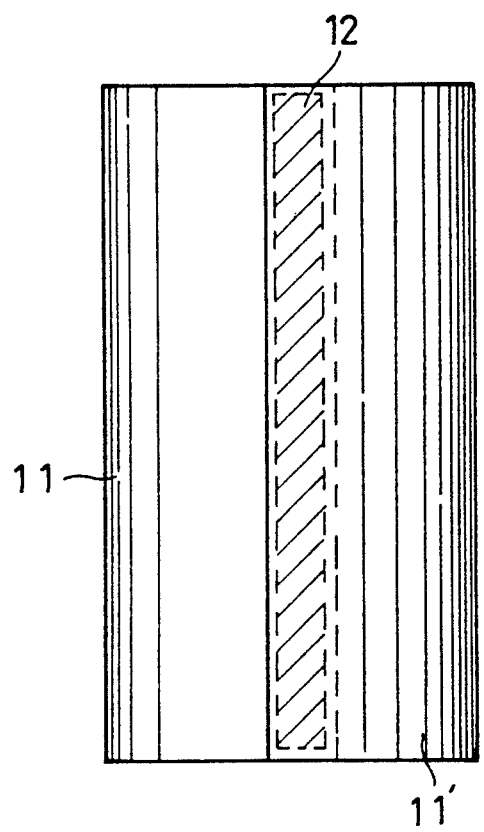

A stainless steel enamel (SC-2710S, made by Nihon Frit) was applied as an inorganic adhesive to the inner surface of a cylindrical base 10 having an inside diameter of 100 mm, a length of 450 mm, and a thickness 2 mm and formed of a material selected from various materials, and silver (Ag) plates 11, 11' having a size of 450 (width)×344 (length)×0.3 (thickness) mm were connected to each other and to the base by a joining method shown in FIGS. 8, 10(a) and 10(b) so as to overlap by 30 mm.

At this time, a $Bi_2Sr_2CaCu_2O_x$ paste was applied to end portions, i.e., lap joint portions 12 of the silver plates 11, 11' and was baked at 900° C. to connect the plates. A reference character 13 denotes an oxide superconductor layer.

The succeeding steps were the same as Examples 18 to 41. A cylindrical oxide superconductor lamination member was thereby manufactured and was tested in the same way as Examples 18 to 41. The results of this test are shown in Table 6.

TABLE 6

| Example No. | Oxide superconductor layer | Adhesive | Precious metal joint strength thermal cycles (times) Ag | Precious metal joint strength thermal cycles (times) Au | Influence upon superconducting characteristics | Total evaluation | Remarks |
| --- | --- | --- | --- | --- | --- | --- | --- |
| 51 | Bi system | $Bi_2Sr_2CaCu_2O_x$ | >10 | — | 100 | ⊚ | |
| 52 | Bi system | $Bi_2Sr_2Ca_2Cu_3O_x$ | >10 | — | 100 | ⊚ | |
| 53 | Bi system | $Bi_2S_2CuO_x$ | 7 | — | 90 | ○ | |
| 54 | Bi system | $Bi_{1.4}Pb_{0.6}Sr_2CaCu_2O_x$ | >10 | — | 100 | ⊚ | (Bi—Pb system) |

⊚ : Excellent ○ : Good

TABLE 7

| | Test piece position | Comparison of superconducting characteristics |
| --- | --- | --- |
| Reference Example 20 | FIG. 9 K | 100 |
| Reference Example 55 | L | 100 |
| Reference Example 56 | M | 100 |
| Reference Example 57 | P | 100 |

TABLE 5

| Example, Reference Example No. | Material of substrate | Oxide superconductor layer | Adhesive | Precious metal joint strength thermal cycles (times) Ag | Precious metal joint strength thermal cycles (times) Au | Influence on super conducting characteristics | Total evaluation |
| --- | --- | --- | --- | --- | --- | --- | --- |
| 42 | SUS430 | Bi system | $Bi_2SR_2CaCu_2O_x$ | >10 | — | 100 | ⊚ |
| 43 | SUS310S | Bi system | $Bi_2Sr_2CaCu_2O_x$ | >10 | — | 100 | ⊚ |
| 44 | Inconel 625 | Bi system | $Bi_2Sr_2CaCu_2O_x$ | >10 | — | 100 | ⊚ |
| 45 | Inconel 600 | Bi system | $Bi_2Sr_2CaCu_2O_x$ | >10 | — | 100 | ⊚ |
| 46 | Incolloy 825 | Bi system | $Bi_2Sr_2CaCu_2O_x$ | >10 | — | 100 | ⊚ |
| | Thickness of silver plate (μm) | | | | | | |
| 47 | 50 | Bi system | $Bi_2Sr_2CaCu_2O_x$ | >10 | — | 100 | ⊚ |
| 48 | 100 | Bi system | $Bi_2Sr_2CaCu_2O_x$ | >10 | — | 100 | ⊚ |
| 49 | 300 | Bi system | $Bi_2Sr_2CaCu_2O_x$ | >10 | — | 100 | ⊚ |
| 50 | 500 | Bi system | $Bi_2Sr_2CaCu_2O_x$ | >10 | — | 100 | ⊚ |
| Ref. Ex. 19 | 30 | Bi system | $Bi_2Sr_2CaCu_2O_x$ | 1 | — | 20 | X |

⊚ : Excellent X: Extremely bad

EXAMPLES 55 TO 57, COMPARATIVE EXAMPLE 20

Superconducting characteristics of test pieces cut out at positions L, M, and P shown in FIG. 9 from the 1200×1200×6 mm oxide superconductor lamination member manufactured in accordance with Example 29 as shown in FIG. 9 were measured. The values of these characteristics relative to the superconducting characteristic value of another test piece cut out at the position K shown in FIG. 9 when the latter value is set to 100 are shown in Table 7.

As is apparent from the results shown in Tables 4, 5, 6, and 7, it can be understood that oxide superconductor lamination members in which a compound having a composition including at least two of the kinds of elements constituting the oxide superconductor layer is used as the adhesive applied to the lap joint portions of the precious metal plates are improved in joining strength as compared with those in which other kinds of adhesive are used, while the desired superconducting characteristics are maintained, and that large oxide superconductor lamination members thus obtained have a critical current density generally uniform over the whole surface.

EXAMPLES 58 AND 59

Four silver plates 1, 1' each having a size of 160 mm (length)×160 mm (width)×300 μm (thickness) were prepared and worked so that their lap joint portions have shapes such as those shown in FIGS. 14(a) or 14(b). Thereafter, an adhesive having a $Bi_2Sr_2CaCu_2O_x$ composition was applied to lap-joint surface 7, 7', and the end portions of the plates were thereby connected to each other with an overlap length of 20 mm, thereby manufacturing a silver plate having a predetermined size.

The silver plate manufactured in this way was then connected to the surface of a stainless steel SUS304 base in the form of a flat plate having a size of 300×300×2 (thickness) mm by a stainless steel enamel (SC-2710S), made by Nihon Frit) provided as an inorganic adhesive.

Next, a slurry prepared by mixing ethyl alcohol and PVB (polyvinylbutyral) in a powder of Bi-system oxide superconductor raw material was applied by spray coating and was dried. Thereafter, the materials are fired at 890° C. at the maximum in an oxygen atmosphere, thereby obtaining a flat oxide superconductor lamination member in which the oxide superconductor ($Bi_2Sr_2CaCu_2O_x$) layer is laminated on the silver base.

This lamination member was subjected to a thermal cycle joining strength test such as to be maintained at −196° C. for one hour in liquid nitrogen, then heated up to 20° C. and maintained at this temperature for one hour. Also, a test piece of a certain size including a lap joint portion of the precious metal plates was cut out at the position N shown in FIG. 9 from the 300×300×2 mm oxide superconductor lamination member. A superconducting characteristic (critical current density) of a superconductor layer portion of this test piece located on the lap-joint of the precious metal plates was measured. Table 8 shows the value of this characteristic relative to the value of the corresponding superconducting characteristic of another test piece cut out at the position K shown in FIG. 9 when the latter value is set to 100.

Test pieces were also cut out from the 300×300×2 mm oxide superconductor lamination member at the other positions L, M, N shown in FIG. 9 and superconducting characteristics of them were measured. The results of this measurement are shown in Table 9.

EXAMPLES 60 TO 62

Figure 11B:
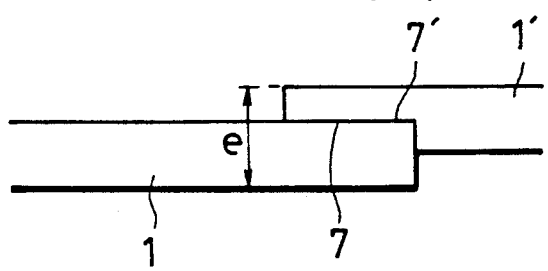
Figure 11C:
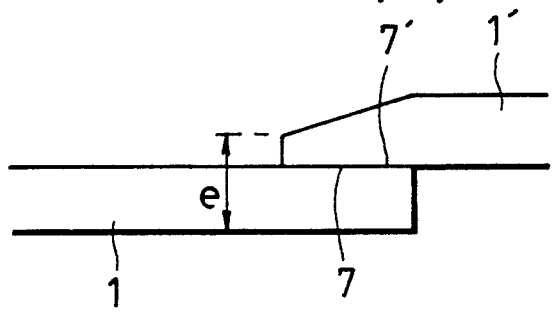

Oxide superconductor lamination members were manufactured in the same way as Examples 58 and 59 except that lap joint portions of silver plates 1, 1' having a thickness of 300 μm were formed so that the thickness e of the lap-joint is thinner than the sum of the thicknesses of the precious metal plates, as shown in FIGS. 11(a) to 11(c) and Table 8. The superconductor members manufactured were tested in the same way as Examples 58 and 59. The results are shown in Table 8.

EXAMPLES 63 AND 64

Figure 12B:
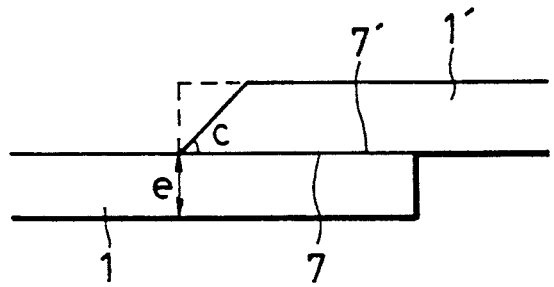

Lap joint portions of silver plates 1, 1' having a thickness of 300 μm were worked and superposed on each other as shown in FIGS. 12(a) and 12(b) and Table 8. In this example, after firing of the lap joint of the silver plates, the end portions thereof were worked. Except for these points, oxide superconductor lamination members were manufactured and tested in the same way as Examples 58 and 59. The results are shown in Table 8.

EXAMPLES 65 TO 69

Oxide superconductor lamination members were manufactured in the same way as Examples 63 and 64 except that lap joint portions of silver plates 1, 1' having a thickness of 300 μm were worked and superposed on each other as shown in FIGS. 13(a) to 13(d) and Table 8. The superconductor members manufactured were tested in the same way as Examples 58 and 59. The results are shown in Table 8.

EXAMPLES 70 TO 73

Lap joint portions of silver plates 1, 1' differing from each other in thickness as shown in Table 8 were worked as shown in FIG. 11(a) and Table 8, and the silver plates 1, 1' were connected by the same method as Examples 63 and 64 and were jointed to the base by being fired. Thereafter, end portion 4' of the silver plate 1' shown in FIG. 11(a) was worked like the curved shape 8 shown in FIG. 13(d) (R1>1000 μm, R2>1000 μm).

Except for these points, oxide superconductor lamination members were manufactured and tested in the same way as Examples 58 and 59. The results are shown in Table 8.

EXAMPLES 74 AND 75

Oxide superconductor lamination members were manufactured and tested in the same way as Examples 70 to 73 except that the lap joint portions of silver plates 1, 1' were worked as shown in FIG. 11(b) or (c). The results are shown in Table 8.

EXAMPLES 76 to 79

Oxide superconductor lamination members were manufactured and tested in the same way as Example 72 except that the material of the base was changed to INCONEL 600, INCONEL 625, INCOLOY 805 or SUS310S. The results are shown in Table 8.

COMPARATIVE EXAMPLES 21 to 24

Silver plates differing in thickness as shown in Table 8 were used, oxide superconductor lamination members were manufactured in the same way as Examples 58 and 59 while leaving the end portions of the silver plates unworked, and were tested in the same way as Examples 58 and 59. The results are shown in Table 8.

TABLE 8

| Example, Reference Example No. | Reference Figure | Silver plate thickness (μm) | Value R (μm) | Value θ (μm) | Superconducting characteristics (critical current density relative value) | Thermal cycle | Total evaluation | Remarks |
|---|---|---|---|---|---|---|---|---|
| Example 58 | FIG. 14 (a) | 300 | — | 300 | 80 | 8 | ○ | |
| Example 59 | FIG. 14 (b) | 300 | — | 300 | 90 | >10 | ⊙ | |
| Example 60 | FIG. 11 (a) | 300 | — | 400 | 60 | 4 | △ | |
| Example 61 | FIG. 11 (b) | 300 | — | 420 | 60 | 3 | △ | |
| Example 62 | FIG. 11 (c) | 300 | — | 450 | 50 | 3 | △ | |
| Example 63 | FIG. 12 (a) | 300 | (C = 45°) | 500 | 30 | 4 | △ | |
| Example 64 | FIG. 12 (b) | 300 | (C = 45°) | 300 | 40 | 3 | △ | |
| Example 65 | FIG. 13 (a) | 300 | 120 | 480 | 40 | 4 | △ | |
| Example 66 | FIG. 13 (b) | 300 | 600 | 300 | 50 | 4 | △ | |
| Example 67 | FIG. 13 (c) | 300 | R = 520, C = 30° | 300 | 70 | 8 | ○ | |
| Example 68 | FIG. 13 (d) | 300 | $R_1$ = 600, $R_2$ = 800 | 300 | 90 | >10 | ⊙ | |
| Example 69 | Combination of FIGS. 13 (C) and 13 (d) | 300 | R-C composite shape | 300 | 90 | >10 | ⊙ | Curve-straight line composite shape in section |
| Example 70 | Combination of FIGS. 11 (a) and 13 (d) | 50 | $R_1$ > 1000 | 50 | 100 | >10 | ⊙ | |
| Example 71 | Combination of FIGS. 11 (a) and 13 (d) | 100 | $R_1$ > 1000 | 100 | 100 | >10 | ⊙ | |
| Example 72 | Combination of FIGS. 11 (a) and 13 (d) | 300 | $R_1$ > 1000 | 300 | 100 | >10 | ⊙ | |
| Example 73 | Combination of FIGS. 11 (a) and 13 (d) | 500 | $R_1$ > 1000 | 500 | 100 | >10 | ⊙ | |
| Example 74 | Combination of FIGS. 11 (b) and 13 (d) | 300 | $R_1$ > 1000 | 300 | 100 | >10 | ⊙ | |
| Example 75 | Combination of FIGS. 11 (c) and 13 (d) | 300 | $R_1$ > 1000 | 300 | 100 | >10 | ⊙ | |
| Example 76 | Combination of FIGS. 11 (a) and 13 (d) | 300 | $R_1$ > 1000 | 300 | 100 | >10 | ⊙ | Base: Inconel 600 |
| Example 77 | Combination of FIGS. 11 (a) and 13 (d) | 300 | $R_1$ > 1000 | 300 | 100 | >10 | ⊙ | Base: Inconel 625 |
| Example 78 | Combination of FIGS. 11 (a) and 13 (d) | 300 | $R_1$ > 1000 | 300 | 100 | >10 | ⊙ | Base: Incoloy 805 |
| Example 79 | Combination of FIGS. 11 (a) and 13 (d) | 300 | $R_1$ > 1000 | 300 | 100 | >10 | ⊙ | Base: SUS 310 S |
| Reference Example 21 | End portion of silver plate was unworked | 50 | — | 100 | 40 | 3 | △ | Metallic base SUS 304 |
| Reference Example 22 | End portion of silver plate was unworked | 100 | — | 200 | 20 | 2 | X | Metallic base SUS 304 |
| Reference Example 23 | End portion of silver plate was unworked | 300 | — | 600 | 10 | 1 | X | Metallic base SUS 304 |
| Reference Example 24 | End portion of silver plate was unworked | 500 | — | 1000 | 0 | 1 | X | Metallic base SUS 304 |

TABLE 9

| Reference Example No. | Reference Figure | Value e (μm) | Superconducting characteristics | Remarks |
|---|---|---|---|---|
| 1 | K in FIG. 9 | — | 100 | |
| 2 | L in FIG. 9 | — | 100 | |
| 3 | M in FIG. 9 | 300 | 100 | |
| 4 | N in FIG. 9 | 300 | 100 | |
| 5 | P in FIG. 9 | 300 | 100 | |

As is apparent from the result shown above, large oxide superconductor lamination members obtained by the present invention can have a generally uniform critical current density, are not easy to separate or break and are capable of maintaining suitable superconducting characteristics during a thermal cycle test.

What is claimed is:

1. An oxide superconductor lamination member comprising a base, precious metal plates and an oxide superconductor layer, said precious metal plates and said oxide superconductor layer being successively laminated on said base, end portions of said precious metal plates being connected by an adhesive so as to form a lap joint, wherein a relationship: D/(d+a) ≧ 1.5 is satisfied where D is a thickness of said oxide superconductor layer not directly over the lap joint, d is a thickness of a portion of the lap joint of said precious metal plates adjacent to the oxide superconductor layer, and a is a thickness of said adhesive layer.

2. An oxide superconductor lamination member comprising a base, precious metal plates and an oxide superconductor layer, said precious metal plates and said oxide superconductor layer being successively laminated on said base, end portions of said precious metal plates being connected so as to form a lap joint, the lap joint of said precious metal plates being covered with a precious metal foil, said precious metal foil being connected to said precious metal plates with a layer of adhesive, and wherein a relationship: D/(d'+a') ≧ 1.5 is satisfied where D is a thickness of said oxide superconductor layer not directly over the lap joint, d' is a thickness of said precious metal foil, and a' is a thickness of the adhesive layer.

3. An oxide superconductor lamination member comprising precious metal bases and an oxide superconductor layer laminated on said precious metal bases, end portions of said precious metal bases being connected by an adhesive so as to form a lap joint, wherein a relationship: $D/(d+a) \geq 1.5$ is satisfied where D is a thickness of said oxide superconductor layer not directly over the lap joint, d is a thickness of a portion of the lap joint of said precious metal bases adjacent to the oxide superconductor layer and a is a thickness of said adhesive layer.

4. An oxide superconductor lamination member comprising precious metal bases and an oxide superconductor layer laminated on said precious metal bases, end portions of said precious metal bases being connected so as to form a lap joint, the lap joint of said precious metal bases being covered with a precious metal foil, said precious metal foil being connected to said precious metal bases with a layer of adhesive, and wherein a relationship: $D/(d'+a') \geq 1.5$ is satisfied where D is a thickness of said oxide superconductor layer not directly over the lap joint, d' is a thickness of said precious metal foil, and a' is a thickness of the adhesive layer.

5. An oxide superconductor lamination member comprising a base, precious metal plates and an oxide superconductor layer, said precious metal plates and said oxide superconductor layer being successively laminated on said base, end portions of said precious metal plates being connected so as to form a lap joint, a portion of the lap joint of said precious metal plates being connected by an adhesive including a compound having a composition essentially consisting of at least two of the elements constituting said oxide superconductor layer.

* * * * *